United States Patent
Bae

[19]

[11] Patent Number: 6,081,011
[45] Date of Patent: Jun. 27, 2000

[54] CMOS LOGIC GATE HAVING BURIED CHANNEL NMOS TRANSISTOR FOR SEMICONDUCTOR DEVICES AND FABRICATION METHOD OF THE SAME

[75] Inventor: Chang-Min Bae, Gyunggi-do, Rep. of Korea

[73] Assignee: Hyundai Electronics Industries Co., Ltd., Yicheon-shi, Rep. of Korea

[21] Appl. No.: 09/200,458

[22] Filed: Nov. 27, 1998

[30] Foreign Application Priority Data

Dec. 30, 1997 [KR] Rep. of Korea ............ 97-79356

[51] Int. Cl.[7] .................. H01L 29/76; H01L 29/94
[52] U.S. Cl. .................. 257/345; 438/276; 438/282; 257/391; 257/392
[58] Field of Search ................. 257/345, 391, 257/392, 203; 438/200, 275, 276, 282, 217

[56] References Cited

U.S. PATENT DOCUMENTS

| | | | |
|---|---|---|---|
| 4,212,683 | 7/1980 | Jones et al. | 148/1.5 |
| 4,574,467 | 3/1986 | Halfacre et al. | 257/203 |
| 4,578,694 | 3/1986 | Ariizumi et al. | 257/345 |
| 5,500,379 | 3/1996 | Odake et al. | 257/203 |
| 5,512,771 | 4/1996 | Hiroki et al. | 257/203 |
| 5,565,375 | 10/1996 | Hiser et al. | 437/56 |
| 5,614,432 | 3/1997 | Goto | 437/56 |
| 5,688,722 | 11/1997 | Harrington, III | 257/203 |
| 5,736,767 | 4/1998 | Yoshitomi et al. | 257/203 |
| 5,767,557 | 6/1998 | Kizilyalli | 257/203 |
| 5,989,949 | 11/1999 | Kim et al. | 438/217 |

*Primary Examiner*—Donald L. Monin, Jr.
*Attorney, Agent, or Firm*—Oliff & Berridge, PLC

[57] ABSTRACT

A CMOS logic gate for a semiconductor apparatus having a buried channel NMOS transistor and a fabrication method of the same are disclosed. The CMOS logic gate according to the present invention includes a pull up unit gate-connected by an input voltage and pulling up an output voltage, a buried channel NMOS transistor connected with the pull up unit and gate-connected by a power voltage, and a surface channel NMOS transistor connected with the buried channel NMOS transistor and gate-connected by the input voltage for pulling down the output voltage for thereby enhancing a reliability of the CMOS logic gate.

11 Claims, 8 Drawing Sheets

CMOS LOGIC GATE HAVING BURIED CHANNEL NMOS TRANSISTOR FOR SEMICONDUCTOR DEVICES AND FABRICATION METHOD OF THE SAME

BACKGROUND OF THE INVENTION

1. Field of the Invention

The present invention relates to a CMOS logic gate and a fabrication method of the same, and in particular, to a CMOS logic gate having a buried channel NMOS transistor and a fabrication method of the same.

2. Description of the Conventional Art

As the VLSI (Very Large Scale Integrated Circuit) is highly integrated, the MOS type semiconductor apparatus has been widely used. Recently, the device is designed to have a channel length of 0.5 micron. The device may be deteriorated due to a hot carrier, so that the reliability of the device may be decreased.

Figure 1:
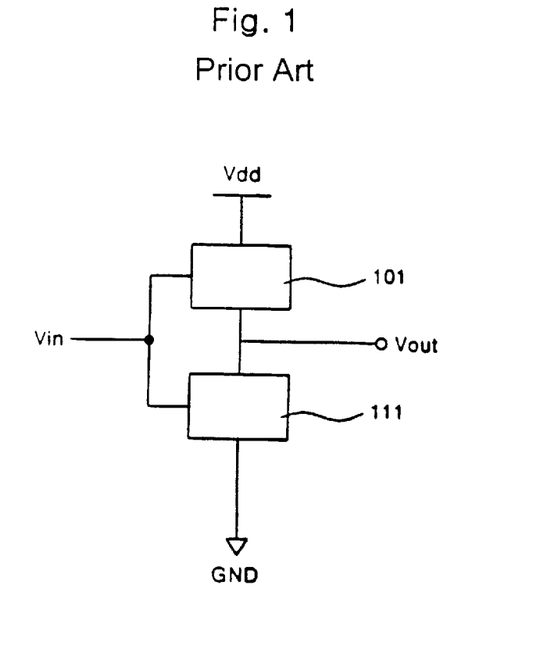
FIG. 1 is a circuit diagram illustrating a conventional CMOS (Complementary Metal Oxide Semiconductor) inverter.

FIG. 1 illustrates a conventional CMOS inverter. As shown in FIG. 1, the conventional CMOS inverter includes a PMOS transistor 101 for pulling up an output voltage Vout to a high level when an input voltage Vin is a low level, and a NMOS transistor 111 for pulling down the output voltage Vout to a low level when the input voltage Vin is a high level. A power voltage Vdd is applied to the source of the PMOS transistor 101, and the source of the NMOS transistor is connected with a ground terminal GND.

The NMOS transistor 111 is a surface channel NMOS ransistor.

Figure 2:
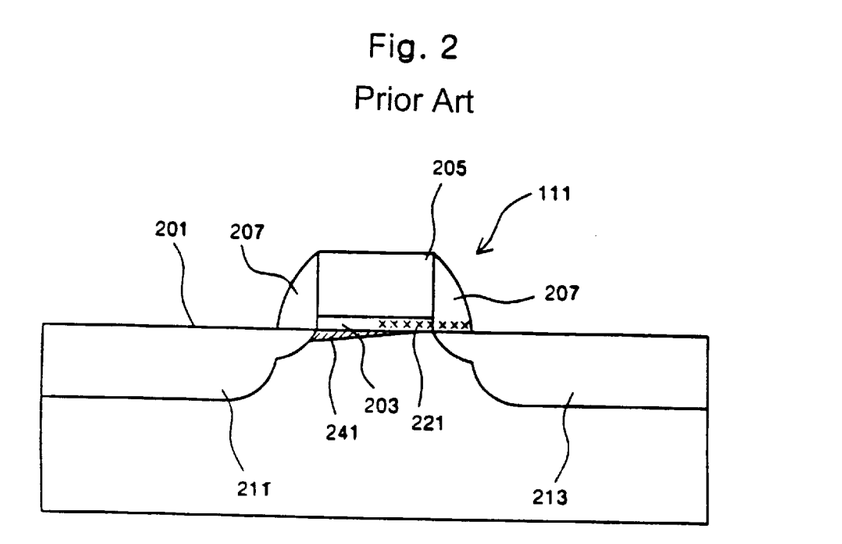
FIG. 2 is a view for explaining the operation of the NMOS transistor as shown in FIG. 1.

FIG. 2 is a view for explaining the operation of the NMOS transistor 111 as shown in FIG. 1. The construction of the surface channel NMOS transistor 111 will be explained with reference to FIG. 2. In the structure of the NMOS transistor 111, gates 203 and 205 are formed on the substrate 201, and a source 211 and drain 213 are formed in the substrate 201. The gates 203 and 205 are formed of an insulation layer 203 and a gate electrode 205. A spacer 207 is formed on a lateral surface of the electrode 205 and the insulation layer 203. A surface channel 241 is formed in the substrate 201 below the insulation layer 203.

The operation of the CMOS transistor of FIG. 1 will be explained with reference to FIG. 2.

When an initial state of the output voltage Vout is a high level, and an input voltage Vin is a high level, the NMOS transistor 111 is operated, and the output voltage Vout becomes a low level. At this time, in the drain region of the NMOS transistor 111, an electric field is formed by the power voltage Vdd at the initial state (high level) of the output voltage Vout. Electrons having a high energy are implanted into the insulation layer for thereby forming a trap 221 based on the impact ionization in the drain region as shown in FIG. 2 based on the hot electron by the repeated switching operations of the electric field and gate voltage. Also an interface trap can be formed on the surface of the insulation layer 203 and the substrate 201. Part of the electrons having a high energy are implanted into the spacer 207 for thereby forming a trap. This trap forms a depletion region at the drain region 213 for thereby increasing an external resistance value of the NMOS transistor 111. Therefore, as the operation of the NMOS transistor 111 is repeatedly performed, the threshold voltage of the NMOS transistor 111 is increased due to the variation of the flat band voltage due to the insulation layer trap 221 of the drain region 213, and an external resistance is increased due to the increase of the depletion region below the spacer 207.

Therefore, the performance of the NMOS transistor 111 is decreased, so that the reliability of the product is degraded, and the life span of the semiconductor apparatus is reduced.

Figure 3:
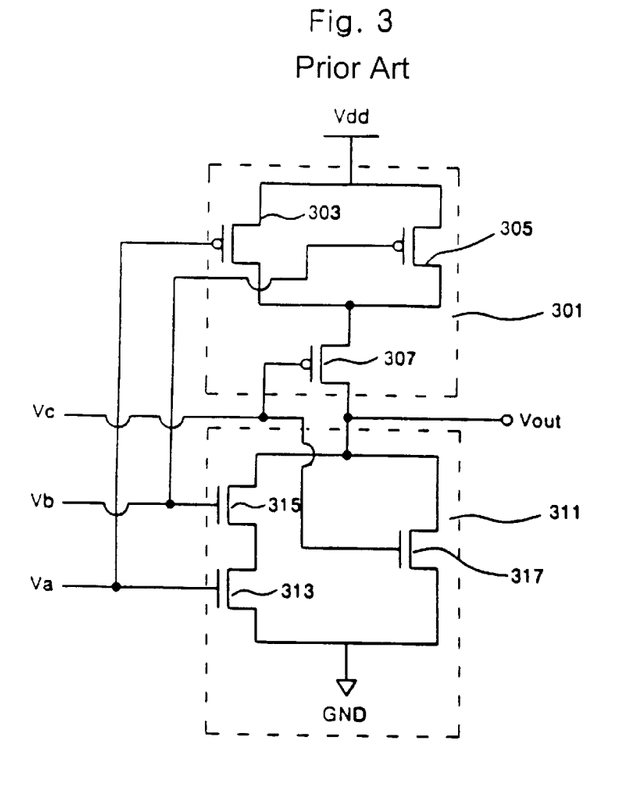
FIG. 3 is a circuit diagram illustrating a conventional CMOS logic gate.

FIG. 3 illustrates the conventional CMOS logic gate. As shown in FIG. 3, the conventional CMOS logic gate is formed of a pull up transistor 301 and a pull down transistor 311. The output voltage Vout of the CMOS logic gate is outputted at the position where the pull up transistor 301 and the pull down transistor 311 are connected each other.

The pull up transistor 301 is formed of PMOS transistors 303, 305 and 307 gate-connected by input voltages Va, Vb and Vc, and the pull down transistor 311 is formed of NMOS transistors 313, 315 and 317 gate-connected by the voltages Va, Vb and Vc. The NMOS transistors 313, 315 and 317 each are formed of a surface channel NMOS transistor.

Figure 4A:
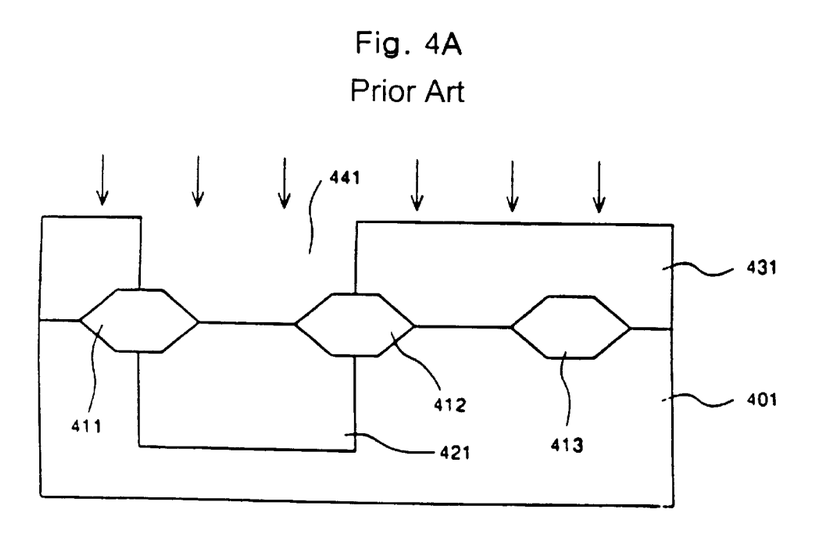
FIGS. 4A through 4C are views illustrating a fabrication process of the CMOS inverter as shown in FIG. 1.
Figure 4B:
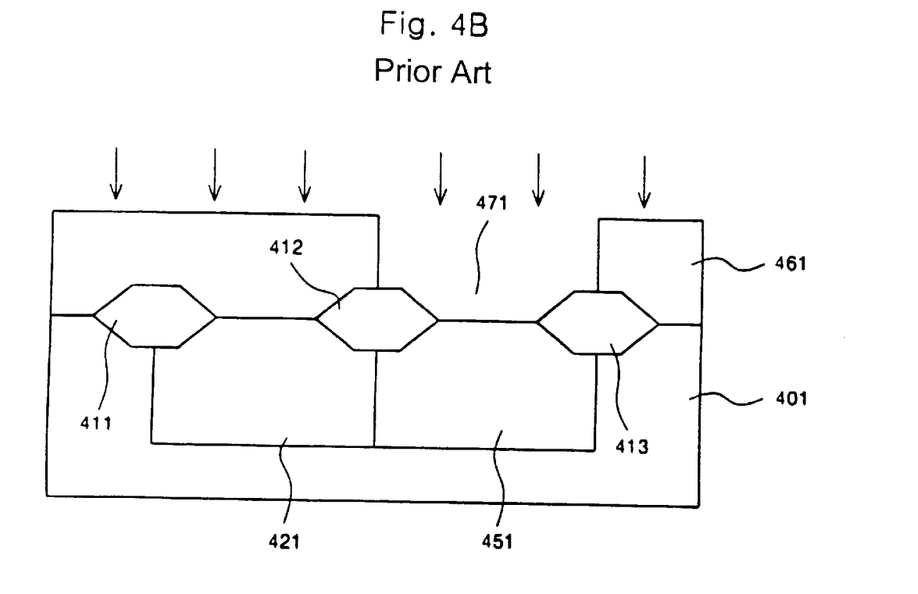
Figure 4C:
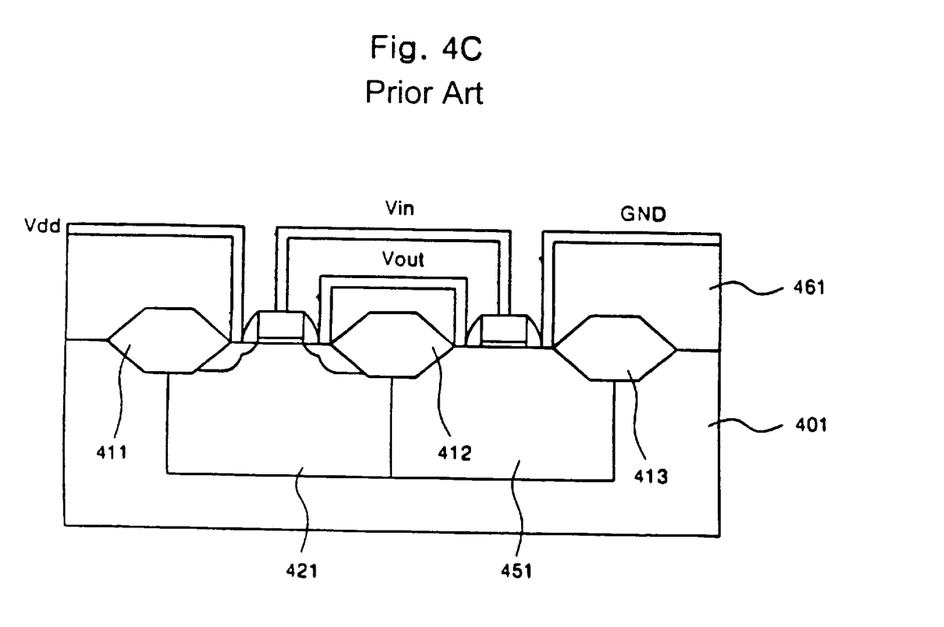

FIGS. 4A through 4C illustrate the fabrication process of the CMOS inverter as shown in FIG. 1.

As shown in FIG. 4A, field oxide films 411, 412 and 413 are formed on the substrate 401, and a photoresist pattern 431 is formed on the substrate 401. A dopant ion 441 is implemented into the substrate 401 for thereby forming the N-well 421, and a dopant ion is implanted into the N-well 421 for controlling the threshold voltage of the PMOS transistor.

As shown in FIG. 4B, the photoresist pattern 461 is formed on the N-well 421, and the dopant ion 471 is implemented. Next, a P-well 451 is formed on a portion near the N-well 421. Thereafter, a dopant ion implantation is performed in order to control the threshold voltage of the NMOS transistor in the P-well 451.

Thereafter, the CMOS inverter as shown in FIG. 4C is formed on various processes.

In the conventional CMOS logic gate, only surface channel NMOS transistor is used. Therefore, the lift span of the NMOS transistor is decreased due to the hot electron effect. As the size of the CMOS logic gate is decreased, the hot electron effect problems are increased, so that the life span of the NMOS transistor is decreased for thereby degrading a reliability of the semiconductor apparatus.

SUMMARY OF THE INVENTION

Accordingly, it is an object of the present invention to provide a CMOS logic gate for a semiconductor apparatus which overcomes the aforementioned problems encountered in the conventional art.

It is another object of the present invention to provide a CMOS logic gate for a semiconductor apparatus which is capable of enhancing a reliability of the product and elongating the life span of the product.

It is another object of the present invention to provide a CMOS logic gate for a semiconductor apparatus having a buried channel NMOS transistor and a fabrication method of the same which are capable of enhancing a reliability of the CMOS logic gate.

In order to achieve the above objects, there is provided a CMOS logic gate for a semiconductor apparatus having a buried channel NMOS transistor which includes a pull up unit gate-connected by an input voltage and pulling up an output voltage, a buried channel NMOS transistor connected with the pull up unit and gate-connected by a power voltage, and a surface channel NMOS transistor connected with the buried channel NMOS transistor and gate-connected by the input voltage for pulling down the output voltage.

In order to achieve the above objects, there is provided a CMOS logic gate fabrication method for a semiconductor apparatus having a buried channel NMOS transistor which includes the steps of forming a field oxide film on a semiconductor substrate for separating devices, forming a N-well in the substrate, forming a first P-well near the N-well, implanting a conductive type dopant into a drain surface of a gate oxide film formed in the first P-well for obtaining a channel region of a buried channel NMOS transistor on which a channel is not formed, forming a second P-well near the first P-well, and implanting a conductive type dopant into the surface of a gate oxide film formed in the second P-well for obtaining a channel region of the a surface channel NMOS transistor on which a channel is formed.

In the CMOS logic gate fabrication method according to the present invention, a N-well formation step further includes a step for implanting a conductive dopant for controlling a threshold voltage of a PMOS transistor in N-well. The conductive dopant is selected from the group comprising BFW and B.

In the CMOS logic gate fabrication method according to the present invention, the second P-well formation step further includes a step for implanting a conductive dopant for controlling a threshold voltage of a NMOS transistor in a second P-well. The conductive dopant is selected from the group comprising As and P.

In the CMOS logic gate fabrication method according to the present invention, the density of the conductive dopant is higher than the density of the dopant for controlling the threshold voltage of the NMOS transistor in order to obtain a channel region of the buried channel NMOS transistor.

Therefore, in the present invention, the reliability of the semiconductor apparatus is enhanced, and the life span of the semiconductor apparatus is elongated.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims as a result of the experiment compared to the conventional arts.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The embodiments of the present invention will be explained with reference to the accompanying drawings.

Figure 5:
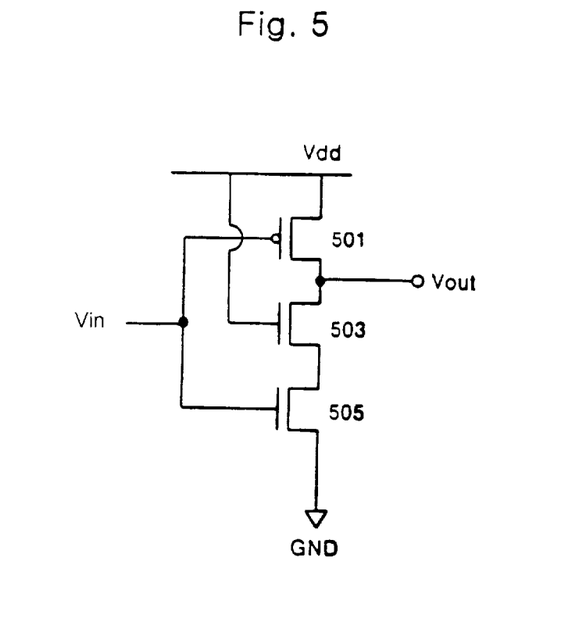
FIG. 5 is a circuit diagram illustrating a CMOS inverter according to the present invention.

FIG. 5 illustrates the CMOS inverter according to the present invention. In FIG. 5, there are shown a PMOS transistor 501, a buried channel NMOS transistor 503, and a surface channel NMOS transistor 505.

The PMOS transistor 501 pulls up an output voltage Vout to a high level when an input voltage Vin is a low level.

The buried channel NMOS transistor 503 is connected with the PMOS transistor 501 and gate-connected by a power voltage Vdd for thereby maintaining a conducting state.

The surface channel NMOS transistor 505 is connected between the buried channel NMOS transistor 503 and a ground terminal GND and pulls down the output voltage to a low level when the input voltage Vin is a high level.

Figure 6:
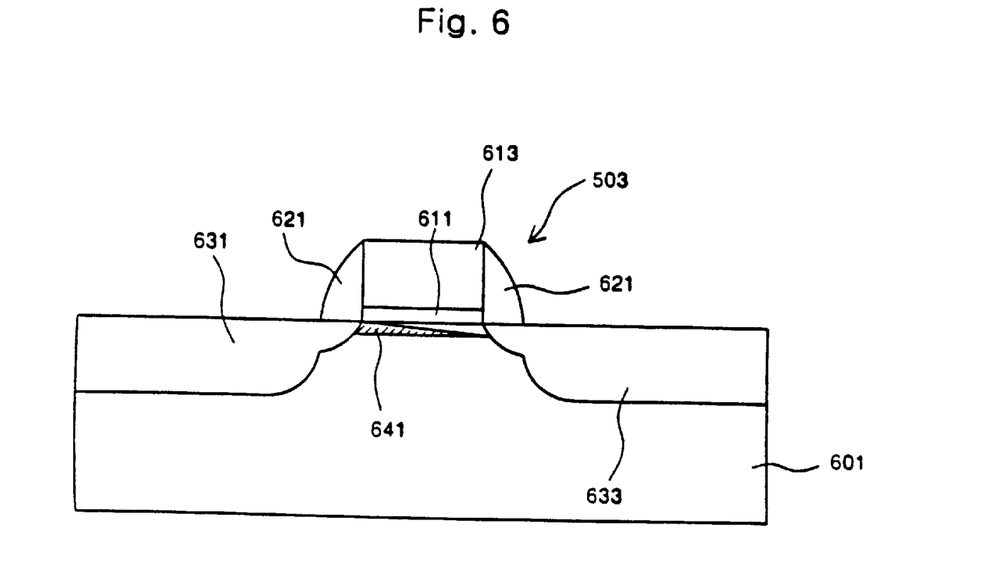
FIG. 6 is a cross-sectional view illustrating the buried channel NMOS transistor as shown in FIG. 5.

FIG. 6 illustrates the buried channel NMOS transistor 503 of FIG. 5. As shown therein, in the buried channel NMOS transistor 503, gates 611 and 613 are formed on a substrate 601, and a source region 631 and a drain region 633 are formed in the substrate 601. The gates 611 and 613 are formed of a gate insulation layer 611, namely, an oxide film and a gate electrode 613, and a spacer 621 is formed around the gate electrode 613 and the gate insulation layer 611. In addition, a buried channel 641 is formed below the gate insulation layer 611. The buried channel NMOS transistor 503 has a good durability against the hot electron effect compared to the surface channel NMOS transistor 505.

Since the buried channel NMOS transistor 503 as shown in FIG. 6 has a good durability, the buried channel NMOS transistor 503 as shown in FIG. 5 is connected with the output voltage Vout, and the surface channel NMOS transistor 505 is connected with a rear portion of the buried channel NMOS transistor 503 for thereby enhancing a reliability of the CMOS logic gate. The hot electron effects directly occur in the drain of the buried channel NMOS transistor 503. Since the current flow path of the buried channel NMOS transistor is formed far from the gate insulation layer 622 compared to the surface channel NMOS transistor 505, the implantation ratio that the electrons having a high energy are implanted into the gate insulation layer 611 or the spacer 621 based on an impact ionization near the drain of the buried channel NMOS transistor 503 is sharply decreased. Therefore, if the surface channel NMOS transistor 505 is connected with a rear portion of the buried channel NMOS transistor 503, the reliability of the CMOS logic gate is enhanced, and the life span of the semiconductor apparatus is extended.

When connecting in the manner shown in FIG. 5, it is possible to implement a desired operation and performance of the CMOS logic gate by simply adjusting the threshold voltage of the buried channel NMOS transistor 503 to a level slightly lower than the threshold voltage of the surface channel NMOS transistor 505 without accurately adjusting the threshold voltage of the buried channel NMOS transistor 503.

Figure 7:
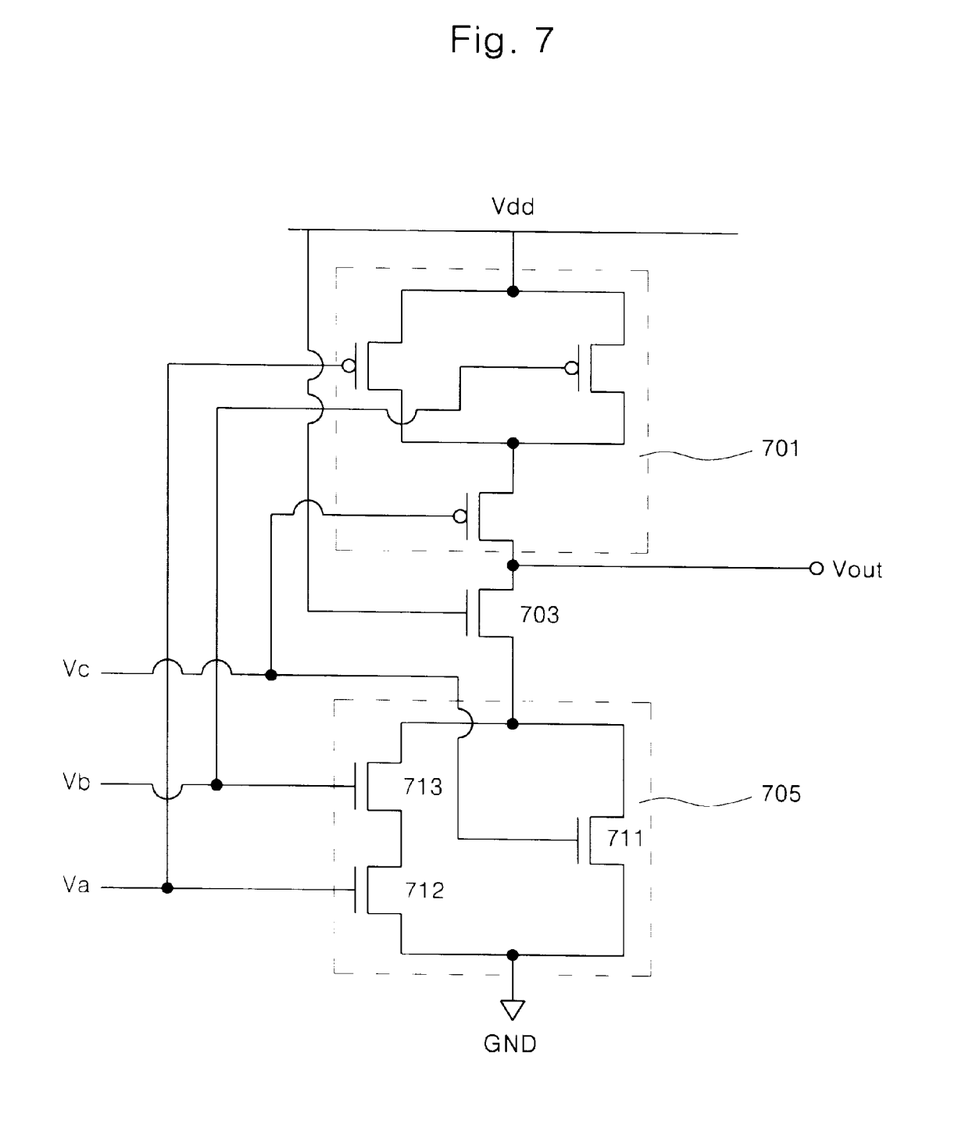
FIG. 7 is a circuit diagram illustrating a CMOS logic gate according to a first embodiment of the present invention.

FIG. 7 illustrates the CMOS logic gate according to a first embodiment of the present invention. In FIG. 7, there are provided a pull up unit 701 gate-connected by input voltages Va, Vb and Vc and pulling up the output voltage Vout, one buried channel NMOS transistor 703 connected with the pull up unit 701 and gate-connected by the power voltage Vdd, and a plurality of surface channel NMOS transistors 711, 712 and 713 connected with the buried channel NMOS transistor 703 and gate-connected by the input voltages Va, Vb and Vc and pulling down the output voltage Vout. In this case, the reliability of the CMOS logic gate is enhanced by simply connecting the surface channel NMOS transistors 711, 712, and 713 to the buried channel NMOS transistor 703, respectively, like the CMOS logic gate as shown in FIG. 5.

Figure 8:
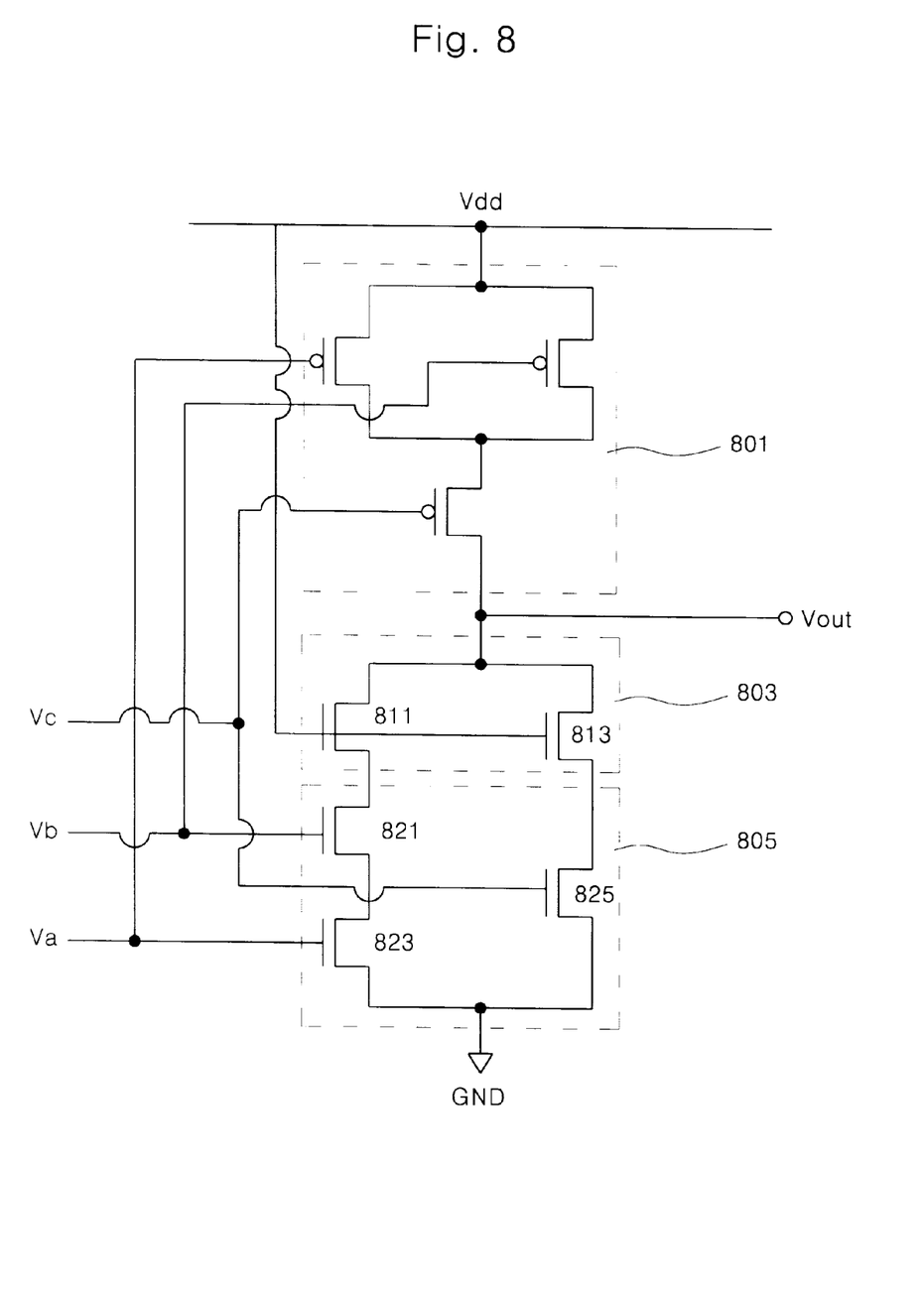
FIG. 8 is a circuit diagram illustrating a CMOS logic gate according to a second embodiment of the present invention.

FIG. 8 illustrates the CMOS logic gate according to a second embodiment of the present invention. As shown therein, the CMOS logic gate according to a second embodiment of the present invention includes a pull up unit 801 gate-connected by the input voltages Va, Vb and Vc and pulling up the output voltage Vout, a buried channel NMOS transistor unit 803 having a plurality of buried channel NMOS transistors 811 and 813 connected with the pull up unit 801 and gate-connected by the power voltage Vdd, and a surface channel NMOS transistor unit 805 having a plurality of surface channel NMOS transistors 821, 823 and 825 connected with the buried channel NMOS transistor unit 803 and gate-connected by the input voltages Va, Vb and Vc and pulling down the output voltage Vout. The reliability of the CMOS logic gate is enhanced by simply connecting the surface channel NMOS transistors 821, 823 and 825 with the buried channel NMOS transistors 811 and 813, respectively, like the CMOS logic gate as shown in FIG. 5.

FIGS. 9A through 9D illustrate the fabrication process of the CMOS inverter as shown in FIG. 5.

Figure 9A:
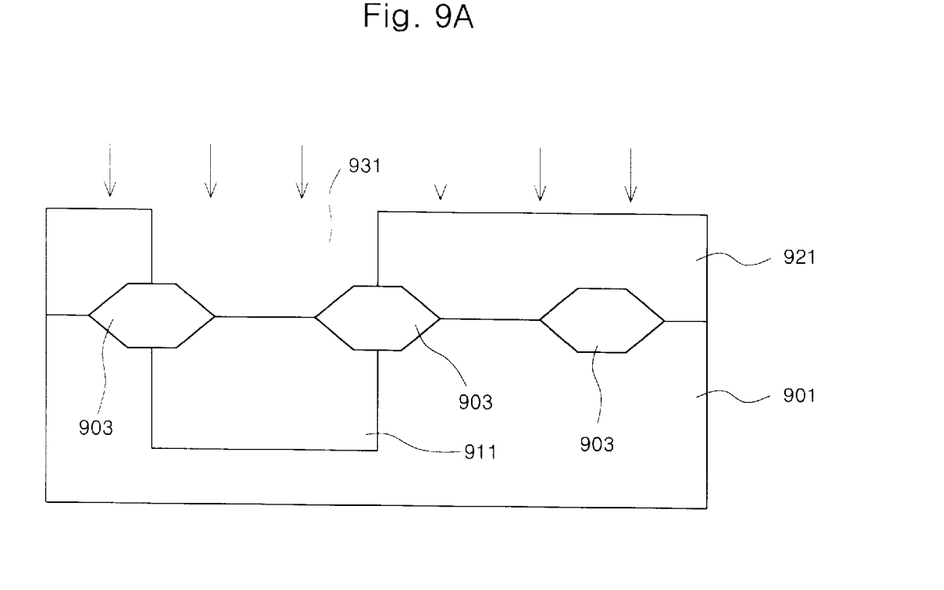
FIGS. 9A through 9D are views illustrating a fabrication process of the CMOS inverter as shown in FIG. 5.

As shown in FIG. 9A, field oxide films 903 are formed on the silicon substrate 901 for separating devices. The photoresist pattern 921 is formed on the substrate 901 for defining the region of the PMOS transistor. As(Arsenic) of a low density is implanted into the substrate 901 as a conductive dopant. Therefore, a N-well 911 is formed in a portion of the substrate 901 corresponding to the region opened by the pattern 921. Next, B (Boron) is implanted into the N-well 911 as a dopant for controlling the threshold voltage of the PMOS transistor. In addition, the photoresist pattern 921 is removed.

Figure 9B:
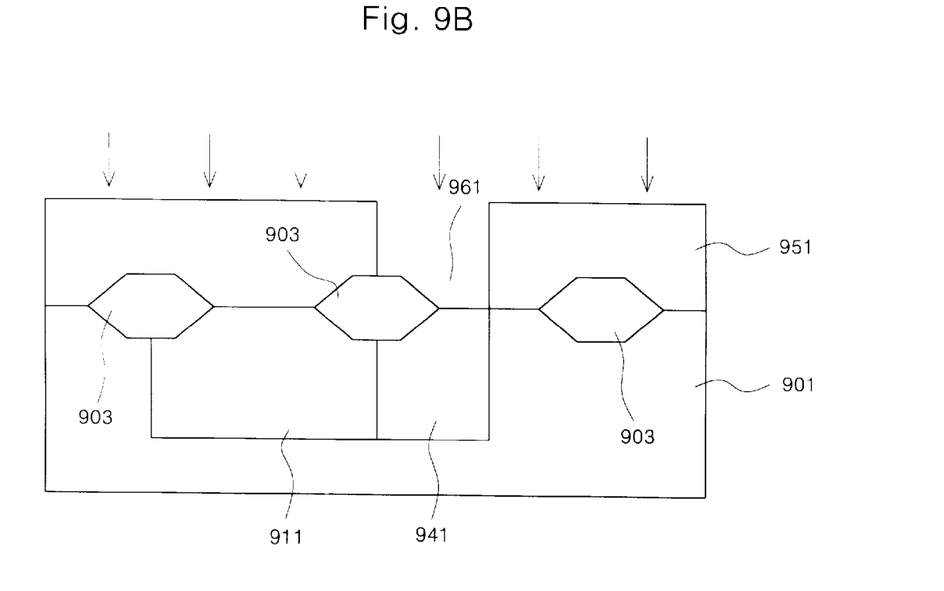

As shown in FIG. 9B, the photoresist pattern 951 is formed on the substrate 901 for defining the region of the buried channel NMOS transistor, on which the channel is not formed, on the drain surface of the gate oxide film, and then B(Boron) of a low density is implanted thereinto as a conductive dopant. Therefore, a first P-well 941 is formed in the substrate 901 of the region 961 opened by the pattern 951. The first P-well 941 is formed near the N-well 911. Next, P(Phosphorus) is implanted into the surface of the first P-well 941 as a conductive dopant for thereby obtaining a channel region of the buried channel NMOS transistor. In addition, in the dopant implantation process, the density of the dopant is higher than the density of the dopant implanted for controlling the threshold voltage of the NMOS transistor. Thereafter, the pattern 951 is removed.

Figure 9C:
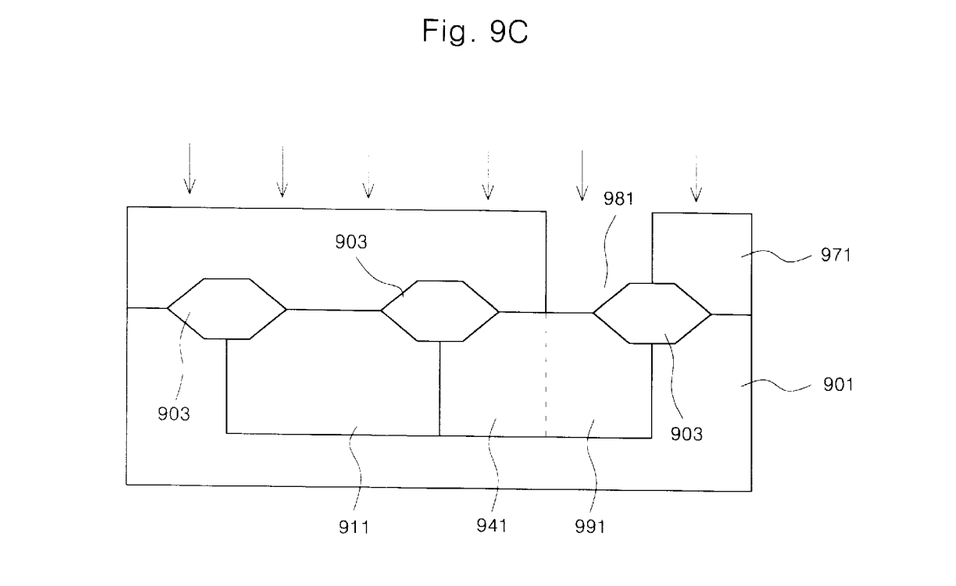

As shown in FIG. 9C, the photoresist pattern 971 is formed on the substrate for defining the region of the surface channel NMOS transistor, and B ion is implanted thereinto as a conductive dopant. Therefore, a second P-well 991 is formed in the substrate 901 of the region 981 opened by the pattern 971. The second P-well 991 is formed near the first P-well 941. Next, P is implanted into the portion near the surface of the second P-well 991 as a dopant for thereby obtaining a channel region of the surface channel NMOS transistor, and then the pattern 951 is removed.

Figure 9D:
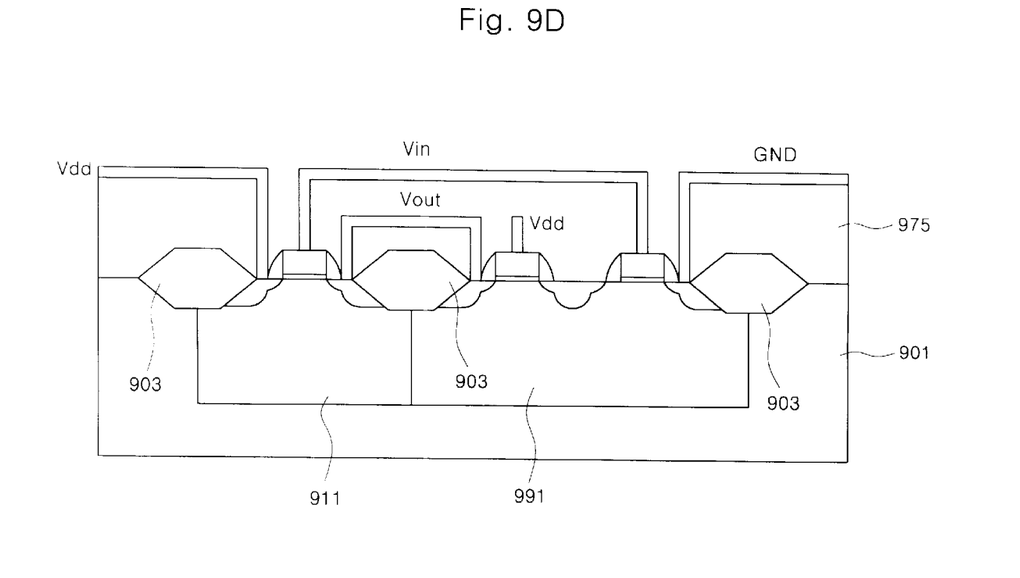

As shown in FIG. 9D, the transistor having a gate electrode and source and drain regions is formed on the substrate 901 including the N-well 911 and the first P-well (not shown) and the second P-well 991 through a known semiconductor device process. The interlayer insulation film 975 is formed on the upper surface of the substrate 901 on which the transistors are formed for implementing an electrical insulation, and then the input/output wiring Vin and Vout, the power voltage wiring Vdd, and the ground wiring GND are formed for thereby fabricating the CMOS inverter according to the present invention.

As descried above, in the present invention, since the buried channel NMOS transistor and the surface channel NMOS transistor are connected in series with the output terminal of the CMOS logic gate, respectively, the reliability of the CMOS logic gate is enhanced, and the life span of the semiconductor apparatus is extended.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A CMOS logic gate for a semiconductor apparatus, comprising:

a pull up unit gate-connected by an input voltage and pulling up an output voltage;

a buried channel NMOS transistor connected with the pull up unit and gate-connected by a power voltage; and a surface channel NMOS transistor connected with the buried channel NMOS transistor and gate-connected by the input voltage for pulling down the output voltage.

2. The gate of claim 1, wherein said pull up unit is a PMOS transistor.

3. The gate of claim 1, wherein there are provided more than one buried channel NMOS transistor.

4. The gate of claim 1, wherein there are provided more than one surface channel NMOS transistor.

5. The gate of claim 2, wherein there are provided more than one PMOS transistor.

6. A fabrication method of a CMOS logic gate for a semiconductor apparatus, comprising the steps of:

forming a field oxide film on a semiconductor substrate for separating devices;

forming a N-well in the substrate;

forming a first P-well near the N-well;

implanting a conductive type dopant into a drain surface of a gate oxide film formed in the first P-well for obtaining a channel region of a buried channel NMOS transistor in which a channel is not formed;

forming a second P-well near the first P-well; and implanting a conductive type dopant into the surface of a gate oxide film formed in the second P-well for obtaining a channel region of a surface channel NMOS transistor in which a channel is formed.

7. The method of claim 6, wherein said N-well formation step further includes a step for implanting a conductive type dopant into the N-well for controlling a threshold voltage of the PMOS transistor.

8. The method of claim 7, wherein said conductive type dopant is one selected from the group comprising $BF_2$ and B.

9. The method of claim 6, wherein said second P-well formation step further includes a step for implanting a conductive type dopant for controlling a threshold voltage of the NMOS transistor in the second P-well.

10. The method of claim 9, wherein said conductive type dopant is one selected from the group comprising As and P.

11. The method of claim 6, wherein said conductive type dopant implantation step for obtaining a channel region of the buried channel NMOS transistor includes a step for using a dopant having a density higher than the density of the dopant for controlling the threshold voltage of the NMOS transistor.

* * * * *